(12) United States Patent
Streif et al.

(10) Patent No.: US 7,149,134 B2
(45) Date of Patent: Dec. 12, 2006

(54) MEMORY DEVICE WITH COLUMN SELECT BEING VARIABLY DELAYED

(75) Inventors: Harald Streif, S. Burlington, VT (US); Stefan Wuensche, Sunnyvale, CA (US); Mike Killian, Richmond, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/259,703

(22) Filed: Oct. 26, 2005

(65) Prior Publication Data

US 2006/0050574 A1 Mar. 9, 2006

Related U.S. Application Data

(63) Continuation of application No. 10/285,027, filed on Oct. 31, 2002, now Pat. No. 7,035,150.

(51) Int. Cl.
*G11C 7/00* (2006.01)
(52) U.S. Cl. .................. 365/194; 365/230.06
(58) Field of Classification Search ........... 365/194, 365/230.06
See application file for complete search history.

(56) References Cited

U.S. PATENT DOCUMENTS

| 6,134,179 A | 10/2000 | Ooishi |
| 6,269,031 B1 | 7/2001 | Fukuhara |
| 2004/0088475 A1 | 5/2004 | Streif et al. |

OTHER PUBLICATIONS

Wuensche, S., et al., "A 110nm 512Mb DDR DRAM with Vertical Transistor Trench Cell," 2002 Symposium on VLSI Circuits Digest of Technical Papers, Mar. 2002, pp. 114-115.

*Primary Examiner*—Jack A. Lane
(74) *Attorney, Agent, or Firm*—Slater & Matsil, L.L.P.

(57) ABSTRACT

A memory device (10) includes an array (12) of memory cells arranged in rows and columns. Preferably, each memory cell includes a pass transistor coupled to a storage capacitor. A row decoder (18) is coupled to rows of memory cells while a column decoder (14) is coupled to columns of the memory cells. The column decoder (14) includes an enable input. A variable delay (32) has an output coupled to the enable input of the column decoder (14). The variable delay (32) receives an indication (R/W') of whether a current cycle is a read cycle or a write cycle. In the preferred embodiment, a signal provided at the output of the variable delay (32) is delayed if the current cycle is a read cycle compared to if the current cycle is a write cycle.

17 Claims, 4 Drawing Sheets

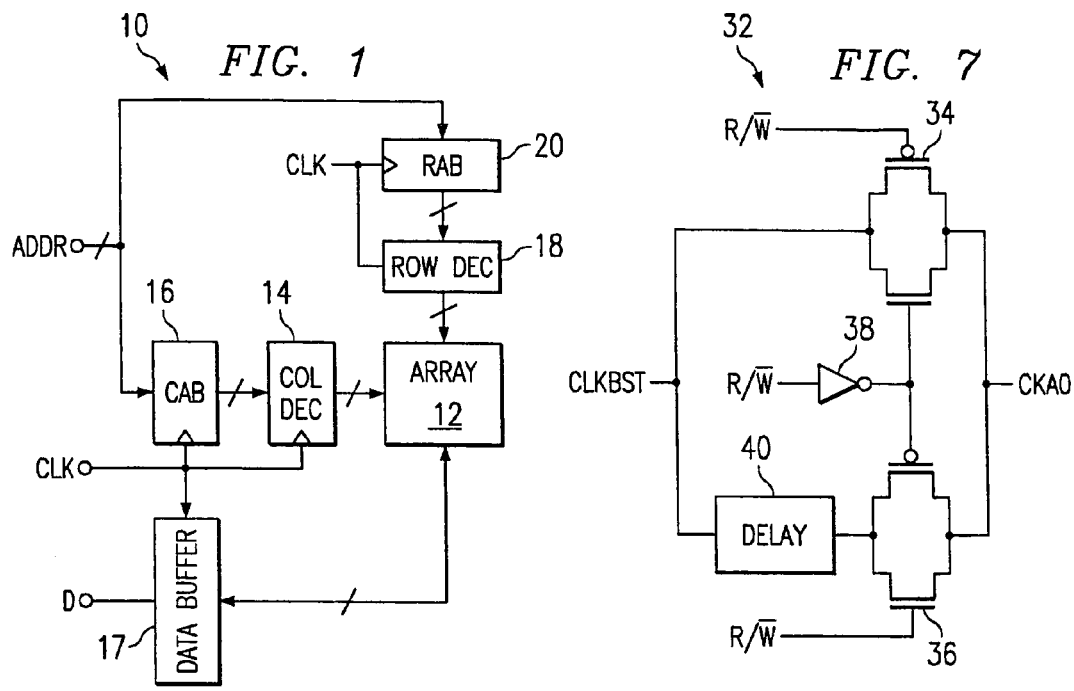
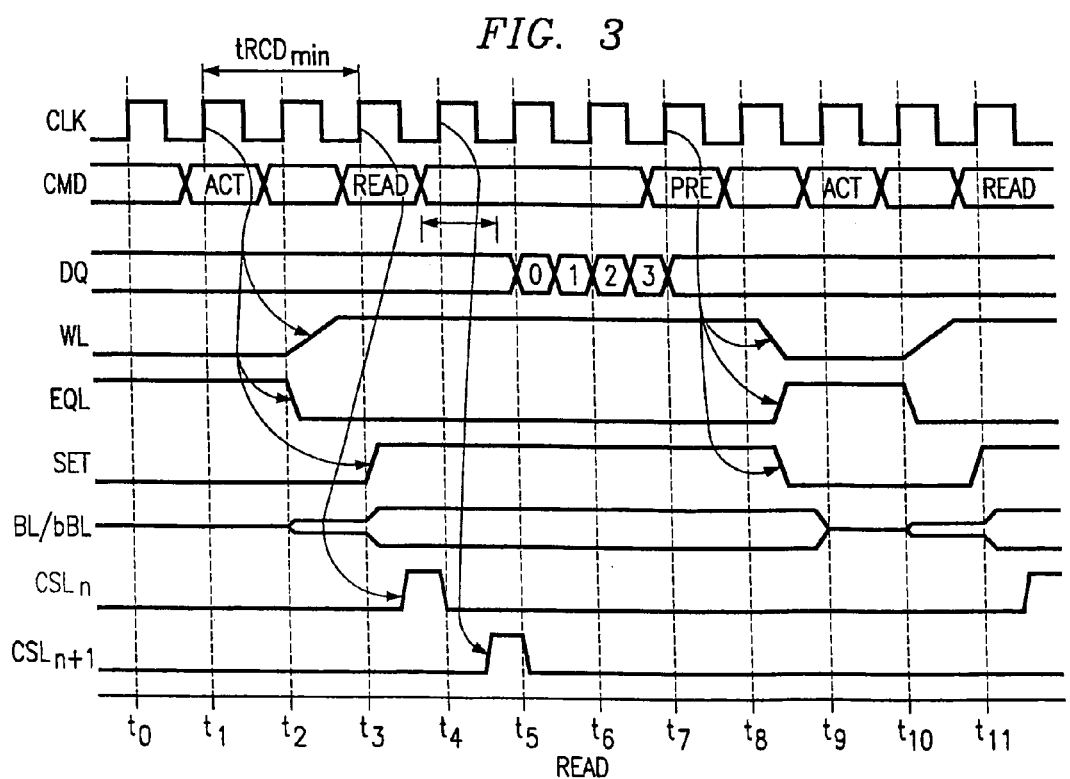

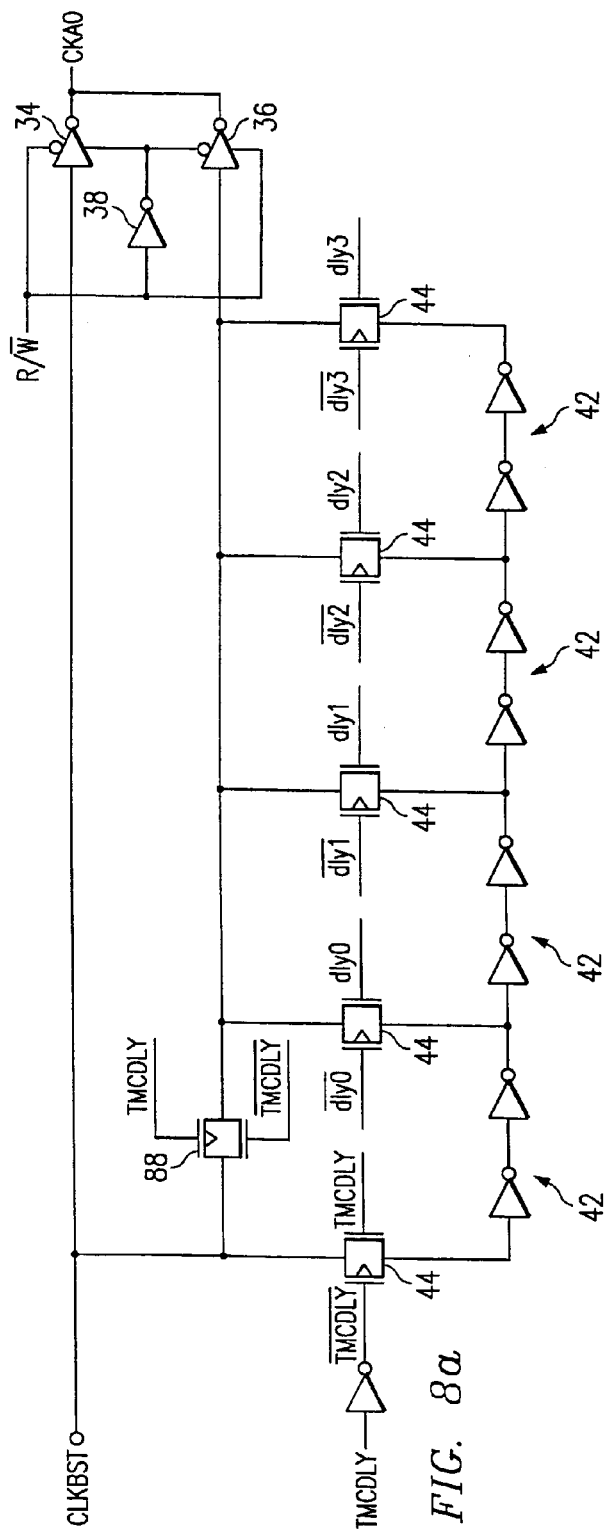
FIG. 8a
FIG. 8b
FIG. 8c
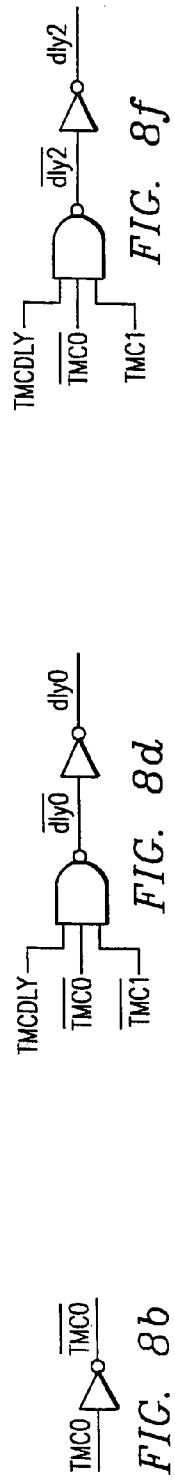
FIG. 8d
FIG. 8e
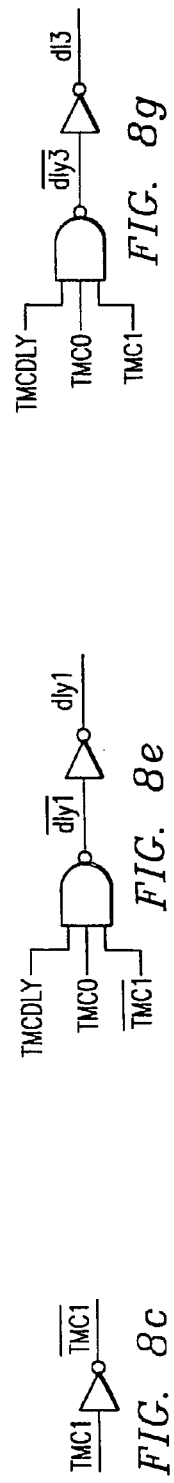
FIG. 8f
FIG. 8g

MEMORY DEVICE WITH COLUMN SELECT BEING VARIABLY DELAYED

This is a continuation of U.S. application Ser. No. 10/285,027, filed Oct. 31, 2002, now U.S. Pat. No. 7,035,150 which application is hereby incorporated herein by reference.

TECHNICAL FIELD

The present invention relates generally to the fabrication of semiconductor devices, and more particularly to the fabrication of memory devices.

BACKGROUND

Semiconductor devices are used for integrated circuits in a variety of electrical and electronic applications, such as computers, cellular telephones, radios, and televisions. One particular type of semiconductor device is a semiconductor storage device, such as a random access memory (RAM) device. RAM devices use an electrical charge to store information. Many RAM devices include many storage cells arranged in a two-dimensional array with two sets of select lines, wordlines and bitlines. An individual storage cell is selected by activating its wordline and its bitline. RAM devices are considered "random access" because any memory cell in an array can be accessed directly if the row and column that intersect at that cell are known.

A commonly used form of RAM is known as a dynamic RAM (DRAM) device. Dynamic random access memory has memory cells with a paired transistor and capacitor, wherein the capacitor requires periodic refreshing. One particular type of DRAM device is a synchronous DRAM (SDRAM) device, in which the memory cells are accessed synchronously. Synchronous dynamic random access memory often takes advantage of the burst mode concept to greatly improve performance by staying on the row containing the requested bit and moving rapidly through the columns. To achieve a high speed operation, a double data rate (DDR) architecture is often used, during which two data transfers are made per clock cycle, one upon the rising edge of the clock and the other upon the falling edge.

SUMMARY OF THE INVENTION

Embodiments of the present invention achieve technical advantages as a method and structure for selectively delaying the column activation for a read command, but not for a write command, in order to optimize device speed. A programmable delay circuit is utilized to create a delay for the read signal, while the write path is designed for maximum speed. The speed of the device is optimized by balancing the minimum delay between a bank activate and a read command and the minimum timing between a read command and a precharge command.

In one aspect, the present invention proposes to delay the column activation in favor of the bank activation for a read command, but to keep the faster column activation for the write command to maintain a full write back. Depending upon whether the device is operating in the read or write mode, it is possible to delay the column clock. This clock feeds into the column and data path and activates the column select, the secondary sense amplifier and the data path control. It is preferred that the write path be designed for maximum speed. The read path, however, can be slowed down by adding delay inverter stages, for example.

In a first embodiment, a memory device includes an array of memory cells arranged in rows and columns. Preferably, each memory cell includes a pass transistor coupled to a storage capacitor. A row decoder is coupled to rows of memory cells while a column decoder is coupled to columns of the memory cells. The column decoder includes an enable input. A variable delay has an output coupled to the enable input of the column decoder. The variable delay receives an indication of whether a current cycle is a read cycle or a write cycle. In the preferred embodiment, a signal provided at the output of the variable delay is delayed if the current cycle is a read cycle compared to if the current cycle is a write cycle.

Advantages of the invention include optimizing SDRAM device speed by selectively delaying the read cycle. The $t_{RCD}$ and $t_{WR}$ signals are optimized, improving device performance. The artificial delay in the column path, in particular the column select line (CSL) signal and secondary sense amplifier activation, allows more time for signal development and amplification during a read command. A maximum operating efficiency may be achieved in accordance with the present invention.

BRIEF DESCRIPTION OF THE DRAWINGS

The above features of the present invention will be more clearly understood from consideration of the following descriptions in connection with accompanying drawings in which:

FIG. 1 illustrates a block diagram of a DRAM device;

FIG. 3 shows a timing diagram for a read cycle of a DDR SDRAM;

FIG. 7 illustrates a schematic diagram of a delay circuit utilized to delay a column select line signal in accordance with an embodiment of the present invention; and FIGS. 8a–8g show a detailed schematic diagram of an embodiment of a programmable delay circuit used to delay the column select line signal in accordance with an embodiment of the present invention.

DETAILED DESCRIPTION OF ILLUSTRATIVE EMBODIMENTS

Figure 2:
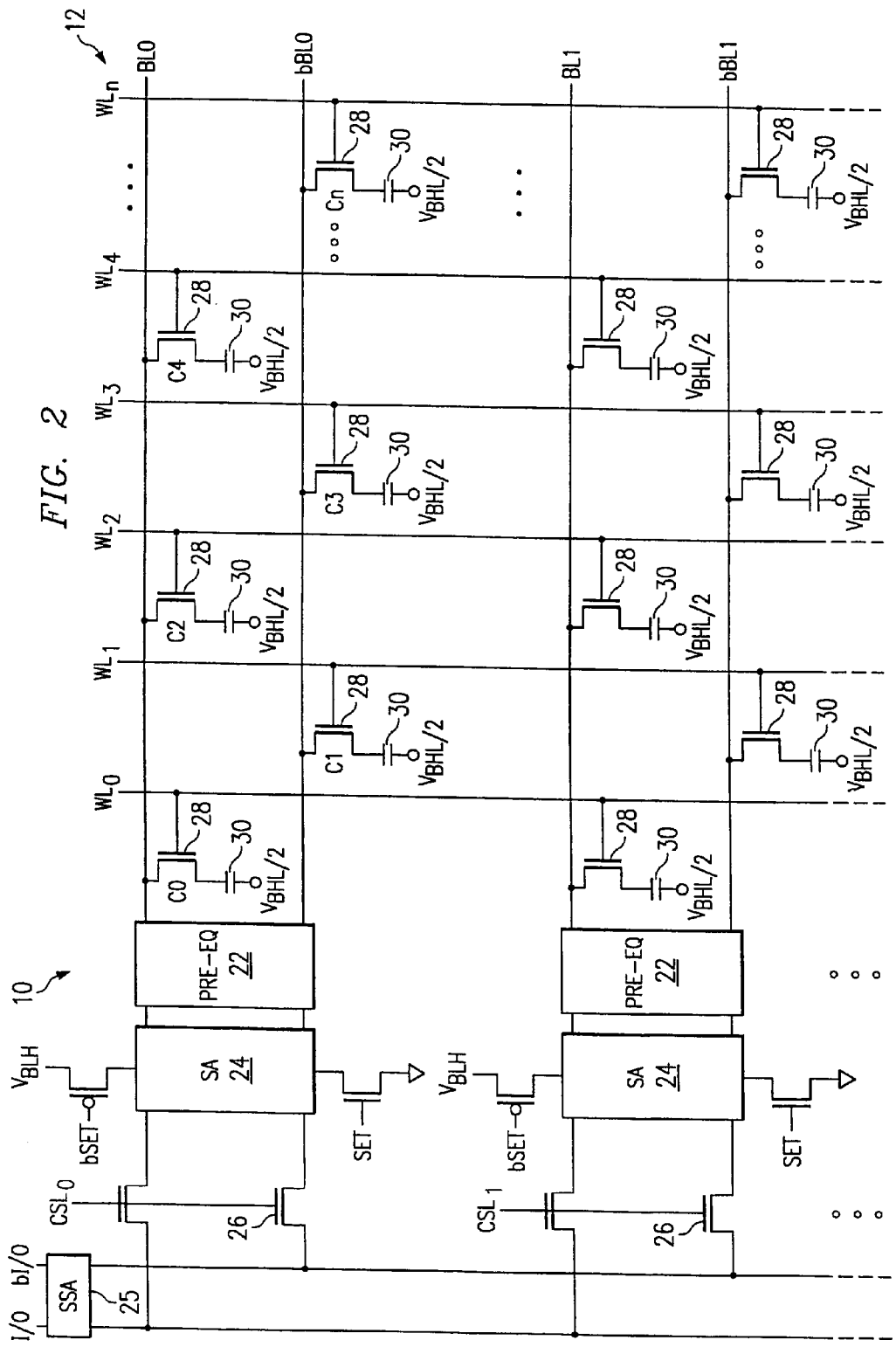
FIG. 2 illustrates an array portion of a DRAM device.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

DRAM device architecture and design implementation issues will first be discussed, followed by a description of preferred embodiments of the present invention and a discussion of some advantages thereof. Although each figure shows certain elements for purposes of discussion, many other components of a memory device may be present in the semiconductor devices shown.

The present invention is related to a paper written by, amongst others, each of the inventors. This paper is entitled "A 110 nm 512 Mb DDR DRAM with Vertical Transistor Trench Cell," 2002 Symposium on VLSI Circuits, Digest of Technical Papers, June 2002, p. 114. This paper is incorporated herein by reference.

FIG. 1 illustrates a functional block diagram of a DRAM device 10. To access a particular cell in the array 12, an address selection signal ADDR is transmitted to a Column Address Buffer (CAB) 16 and Row Address Buffer (RAB) 20. In a typical DRAM chip, the column address and row address share external pins so that the row address is received at a first time and the column address is received at a second time. The ADDR signals may be transmitted by an external device, such as a memory controller (not shown), for example.

The column address buffer 16 and row address buffer 20 are adapted to buffer the address signal. The outputs of the column address buffer 16 and row address buffer 20 are coupled to a column decoder 14 and row decoder 18, respectively. The column and row decoders 14 and 18 are adapted to decode the signals received from the column address buffer 16 and row address buffer 20, respectively, to provide the signal input to the array 12, such that the selected row and column can be selected. In the preferred embodiment, the column address buffer 16 includes a variable delay that will vary the addressing path time depending upon whether the operation is a read or a write.

In FIG. 1, the column and row decoders 14 and 18 are shown as single blocks. It should be understood, however, that the column and row decoders 14 and 18 may carry out several levels of predecoding and decoding. Some or all (or none) of these levels may be clocked.

Data D that is addressed in array 12 will be written into memory 12 or read from memory 12 via data buffer (DB) 17. Once again, this portion of FIG. 1 is simplified. The data buffer 17 and associated line are provided to represent the read and write path, which may include a large number of lines and other components (e.g., secondary sense amplifiers).

FIG. 1 also shows a clock input CLK to illustrate that the memory device could be synchronous. To further illustrate this point the clock signal CLK is provided to each of the blocks. It is understood that while the external clock could be provided to various elements in the array, a number of clocking signals, which may operate continuously or only when needed, may be derived from the clock.

FIG. 2 shows more detail of the memory array 12. As shown in FIG. 2, the memory array 12 includes a plurality of memory cells arranged in a matrix-type architecture or array. Each cell $C_0$, $C_1$, $C_2$ . . . $C_n$ includes an access transistor 28, typically an n-channel metal oxide semiconductor field effect transistor (MOSFET), coupled in series with a capacitor 30, shown in the inset of FIG. 2. The gate of each access transistor 28 is coupled to a wordline $WL_0$, and one source/drain region of the transistor 28 is coupled to a bitline BL0, as shown. A second source/drain region of the transistor 28 is coupled to one end of the storage capacitor 30. The other end of the storage capacitor 30 is coupled to a reference voltage, such as $V_{BHL}/2$, for example.

The bitlines are organized as bitline pairs, e.g., BL0 and bBL0. Each bitline pair BL0/bBL0 is coupled to a sense amplifier 24, which is configured to amplify the voltage difference between the two bitlines in a pair. Traditional mid-level sensing is accomplished using latch-type sense amplifiers with a bitline high level of 1.5 V. Equalization and pre-charge circuitry 22 is also coupled between each bitline in a pair to provide the proper initial voltages on the bitlines.

In a particular embodiment, the DRAM device 10 includes four 128 Mb memory quadrants, each of which corresponds to an individual logical bank. Each 128 Mb bank may be physically separated into a number of blocks, e.g., 16 blocks, each with 8 Mb in a folded bitline configuration. There may be 512 bits for each bitline and the bitline-to-bitline noise can be minimized by twisting the bitlines. A block may comprise 1024 local wordlines. The blocks may be separated by stripes of 4 k sense amplifiers on the right and left sides, which are shared by neighboring blocks. Each block may then be divided into 16 sections by rowgaps with each section containing 512 kb. A local data line (LDQ) spans two sections so that, in the column direction, the sections are paired, forming eight column segments.

In operation, the bitlines are pre-charged to an initial value, typically one half of the value of a physical one written into a cell. In the preferred embodiment, this voltage level is referred to as $V_{BLH}$ (bitline high) and is about 1.5 V. Preferably, $V_{BLH}$ is generated on-chip. The equalization circuitry 22 is provided to ensure that each bitline in a pair is pre-charged to the same level, e.g., $V_{BLH}/2$ or about 0.75 V. The pre-charge and equalization circuitry 22 is enabled by a signal EQL.

To read a data bit from the array, a high voltage (e.g., $V_{PP}$) is placed on a selected one of the wordlines WL. This signal will be generated by the row decoder 18 (FIG. 1). In a typical embodiment, $V_{PP}$ is derived from the external supply voltage.

The high voltage on the wordline will cause the pass transistor of each memory cell coupled to that wordline to be conductive. Accordingly, charge will travel either to the bitline from the memory cell (in the case of a physical one, e.g., $V_{BHL}$) or from the bitline to the memory cell (in the case of a physical zero, e.g., 0V). The sense amplifier 24, when activated by signal SET, will sense the physical one or zero and generate a differential voltage that corresponds with the signal read from the cell.

A pair of pass transistors 26 is provided between each column and the local input/output lines I/O and bI/O. Since the sense amplifier 24 associated with each column (only $BL_0/bBL_0$ and $BL_1/bBL_1$ are shown) will generate a bit that corresponds to cell associated with the selected row (as determined by the selected wordline), a column select signal $CSL_n$ is provided to the pass transistors 26 to select one of the columns, which is coupled to the local I/O. (Of course, some architectures will include multiple I/O's in which case a single select signal $CSL_n$ is coupled to the pass transistors 26 of more than one column.)

A secondary sense amplifier (SSA) 25 is coupled to each I/O line to amplify the voltage level. The SSA 25 is timed off of the logic which enabled the CSL. In the preferred embodiment, this circuitry contains not only a sense amplifier for reading, but also write buffers for driving the I/O lines. Basically the "SSA" can be in one of three states: precharged (if no read or write), reading, or writing.

When a read command is issued, the CSLs get activated, and the sense amplifiers (basically clocked latches) are connected to the I/O lines. The clocking of the latches is synchronized with the CSL activation. When a write command is issued, the CSLs are again activated, but the sense amplifier is disconnected from the I/O lines and the write drivers are connected instead. As in the case of a read, the clocking of the drivers is synchronized with the CSL activation.

A write operation will be performed in a similar fashion as a read. First, a wordline must have been previously activated, e.g., a bank is active. Subsequently, data is placed on the I/O lines and the CSLs are activated. This overwrites the primary sense amplifier, causing the BL and bBL to change (only in the case of a different data state) and the data is transferred to the memory cell.

To be compliant with international standards for reading or writing data in or out of SDRAM devices, a sequence of timings must be met. For example, the majority of DRAMs sold today comply with the standards set by JEDEC (once known as the Joint Electron Device Engineering Council). See e.g., JEDEC Double Data Rate (DDR) SDRAM Specifications JESD79, DDR3332.5–3.3 and DDR 266 2-2-2, which are incorporated herein by reference.

Figure 4:
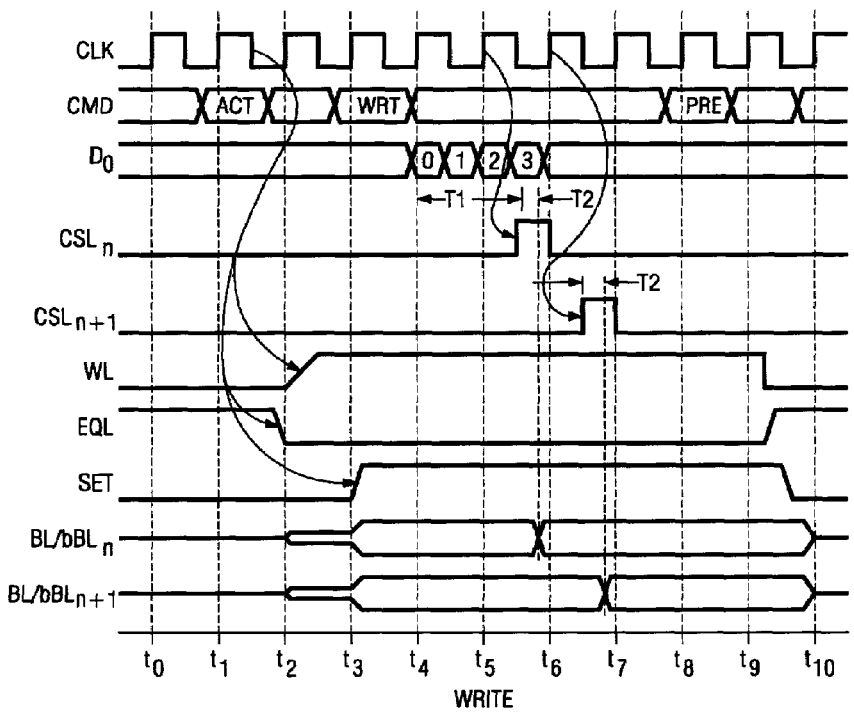
FIG. 4 shows a timing diagram for a write cycle of a DDR SDRAM.

FIG. 3 shows a timing diagram for a read cycle for a DDR SDRAM device. A write cycle is shown in FIG. 4. In a JEDEC-compliant DRAM, a bank activate reads all of the bits in the cells of a selected row and stores them in the sense amplifiers. An entire page of data (e.g., 4 k or 8 k bits, depending on the page length) is stored. Upon receiving a read command, in a ×4 design or ×8 design, this number of bits, having already been latched, can be read. An activate command can be seen as an internal read command.

Referring first to FIG. 3, the read operation will be described. To begin, at time to, the bitlines BL/bBL are pre-charged and equalized to a value of $V_{BLH}/2$ and the sense amplifier 24 is disabled. Accordingly, the pre-charge/equalization enable signal EQL is high and the sense amplifier enable signal SET is low.

To read data, the rows of the array 12 are decoded by the row path, e.g., in response to a bank activate command ACT, which is recognized upon the rising edge of clock signal CLK at time $t_1$. The signal line labeled CMD may be derived from a number of pins, e.g., a read pin, a write pin, and/or a clock/enable pin, according to the device specifications, which are decoded to provide a particular command. The bank activation causes signal EQL to go low, thereby causing the equalization circuitry 22 to be disabled in the specified sub-block. Also, the row decoder 18 will select one of the wordlines WL, which will rise. As a result of the rise of a selected wordline WL, a differential signal develops on the bitlines BL/bBL. After a delay time, the sense amplifier is activated by signal SET and the differential signal is amplified by each primary sense amplifier 24 in a stripe of sense amplifiers.

According to the JEDEC specification, the read command READ can be issued as soon as two clock cycles after activate command ACT, in this case at time $t_3$. The time between the activate command ACT and the read command READ (i.e., the time between $t_1$ and $t_3$) can be referred to as the time from row to column delay or $t_{RCD}$. As noted above, the JEDEC DDR SDRAM standard specifies that $t_{RCD}$ minimum=2. A critical timing of a DRAM device is that the CSL signal must not go high until the sense amplifier 24 is sufficiently set. The signal development time is the time from when the word line is activated until the sense amplifier 24 is ready to be activated.

The READ command causes the selection of the appropriate column. The column select line CSL signal connects the selected column, typically through the primary sense amplifier, to the local I/O's, which carry a differential signal to the secondary sense amplifier (not shown). From here, the data can be routed to the output DQ.

Internal control circuitry, not shown, will cause the activation of CSLs for each data prefetch. Due to architecture constraints, more than one CSL may be required to prefetch enough data for a particular I/O width. Thus, two CSL lines (labeled $CSL_n$ and $CSL_{n+1}$) are shown. FIG. 3 shows four data words being read out. Since the illustrated device is a double-data rate device, two data words are read on each clock cycle.

After the wordline has been activated for a minimum amount of time, the wordline can be reset to begin another cycle. The pre-charge cycle can be initiated by issuing a pre-charge command PRE at time $t_7$. The pre-charge command will cause the wordline to turn off (i.e., WL goes low) thereby isolating all memory cells from the bitlines. The sense amplifiers 24 are deactivated by switching the signal SET to a low value and the pre-charge and equalization circuitry 22 is activated by switching the signal EQL to a high value. This sequence will cause the bitlines to be set to the precharge voltage of $V_{BLH}/2$.

FIG. 3 also shows the start of a second read cycle, which includes an activate command ACT received at time $t_9$ and a read command READ received at time $t_{11}$. The second read cycle operates in the same manner as the first read cycle.

FIG. 4 illustrates a write cycle, which is similar to a read cycle. To write data, a bank activate command ACT is issued at time $t_1$, which decodes the x-direction and selects the wordline WL. The write command WRT is applied as soon as two clock cycles later, at time $t_3$. One clock cycle later, the data DQ is latched, so the rising edge of the clock CLK brings the first bit of data and the falling edge brings the second bit of data. In a four-bit burst, the following rising edge of the clock brings the third bit and the falling edge brings the fourth bit. The rising edge of the clock two cycles later will cause the column select signal $CSL_n$ to go high. When the CSL signal is high, the sense amplifier 24 and the cell are written to. The data bits are written in pairs. Accordingly, bits 0 and 1 (see BL/$bBL_n$) are written when the $CSL_n$ signal goes high, and bits 2 and 3 (see BL/$bBL_{n+1}$) are written when the $CSL_{n+1}$ signal goes high.

The DDR SDRAM specification requires, that from the rising edge of the clock after the last bit of data ($t_6$), there must be two clock cycles before another pre-charge cycle can occur at time $t_8$. Note that the CSL signal goes high into the first clock cycle of this wait period, e.g., between $t_6$ and $t_7$. The data must be fully written into the cell before the wordline WL can be turned off.

Two JEDEC specification timings are related to the read command. First, the Row to Column Delay ($t_{RCD}$) is defined as the minimum delay between a bank activate and a read command. The minimum is two clock cycles. The CAS latency (CL) is the timing, in clock cycles, between receipt of a read command and the time data is valid. The CAS latency can be either 1.5, 2, 2.5 or 3 clock cycles.

A problem exists in that there are conflicting demands in the timing for read and write operations of DDR SDRAM devices. For example, for a DDR PC266 SDRAM device, having a 133 MHz clock frequency, with a row to column delay of two ($t_{RCD}=2$) and a CAS latency of two (CL=2), the 15 ns time (1/133 MHz*$t_{RCD}=15$ ns) between bank activation and read command may not be sufficient for proper signal development and amplification before the read takes place. Therefore, an additional delay for the final column path activation is introduced, which means that part of the READ timing is taken to satisfy the signal development/amplifying process. Accordingly, less time is used to transfer the data from the primary sense amplifier to the DQ pins, a process initiated by the activation of the column select signal CSL. Referring to FIG. 3, this tradeoff can be visualized as moving the CSL signal to the right.

However, any delay in the column path is detrimental to the write-back time. During a write command, the data has less time to propagate from the DQ pins through the I/O lines to the sense amplifier 24 and the bitlines, and then to settle in the cell. This issue can be seen with reference to FIG. 4. During a first time period, labeled $T_1$, the data travels from the DQ pins to the local I/O's. When the CSL signal is activated, the data is applied to the column, e.g., sense amplifier 24, where it can be written to the cells. This happens in the period labeled $T_2$. In typical embodiments, this time may be about 1 or 2 ns after the CSL signal is activated.

As noted above, the read timing requirements wanted the CSL signal to be delayed. This shift, however, would be detrimental in the write cycle. If CSL were delayed in time for a WRITE, there would be less time for the bitlines and cell to charge up, so that data would not be fully written into the memory cells. In other words, for the write operation, it is desirable that the CSL signal be activated early in the cycle. The severity of this problem is dependent upon the actual device configuration and speed requirement. For example, for a DDR PC333 having a clock frequency of 166 MHz, and a $t_{RCD}$ of 2.5, the timings are relaxed.

In accordance with an embodiment of the present invention, the column activation is delayed in favor of the bank activation for a read command, while the column activation for the write command is kept faster, in order to maintain a full write back.

In accordance with an embodiment of the invention, to produce a memory device having an increased operating frequency, the time interval $t_{RCD}$ is improved by delaying the time that a read cycle takes to activate the CSL. The CSL signal is delayed so that the column selection actually occurs later. This technique is achievable in memory devices having an independent column path between a read path and a write path. Although, as acknowledged in accordance with novel aspects of embodiments of the present invention, there is margin to delay the CSL signal for a read cycle, a delay is not desirable in a write cycle. Because of the physical structure of the array wordlines and bitlines, the column path is faster than the row path; therefore, the column access time is artificially slowed down to achieve an improved row access time.

In accordance with a preferred embodiment of the present invention, the time from the rising edge of the clock at $t_2$ when a read or write command is received, to the time when the signal CSL is activated, is delayed during a read but not during a write. In a particular embodiment, the amount of CSL delay for a read cycle can be tuned in order to optimize the yield, e.g., to balance the $t_{RCD}$ and $t_{RP}$. For example, a programmable delay circuit can be provided, so that completed memory devices can be tested, and then when the desired delay is determined, the device can be either temporarily or permanently programmed with a CSL delay for a read cycle.

Figure 5:
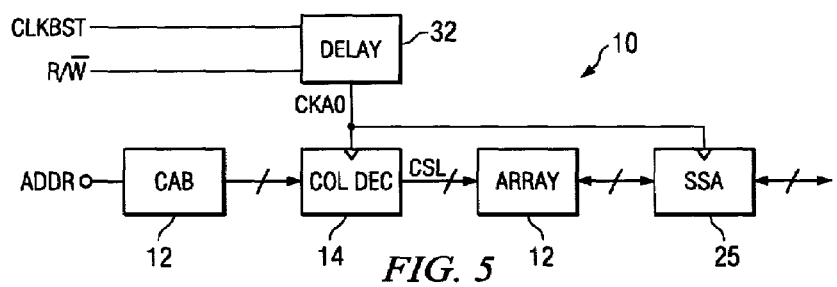
FIG. 5 shows a block diagram of the delayed column select line signal being used to access the memory array.

FIG. 5 shows a block diagram of a preferred embodiment implementation of the circuit of the preferred invention. As in FIG. 1, the column address path extends from the address pins ADDR to the column address buffer 16 to the column decoder 14, which provides the CSL control signals to the array 12. In this example, the column decoder 14 is enabled by a clock signal CKA0. The CKA0 clock signal is provided by a variable delay circuit 32. In this embodiment, the CKA0 clock signal is also applied to the secondary sense amplifier 25.

The delay circuit 32 receives two inputs. The clock signal CLKBST (burst clock) represents an undelayed version of the column decoder enable clock. The R/W' (read/write) control signal determines the delay, preferably selecting between one of two choices. In the preferred embodiment, when the R/W' control signal indicates a write operation, the input clock signal CLKBST is passed through as the output clock CKA0. On the other hand, when the R/W' control signal indicates a read operation, the clock signal CKA0 is a delayed version of the input clock CLKBST. The amount of the delay can be determined according to the specific timing of the circuit.

Figure 6:
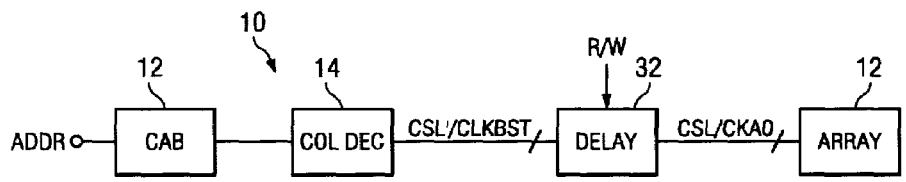
FIG. 6 shows a block diagram of an alternate embodiment with a column select delay.

FIG. 6 illustrates an alternate embodiment. In this case, the delay circuit 32 is put in the CSL signal path, as opposed to in the path of the enable signal. This embodiment can be used in the case of both clocked decoders and unclocked (asynchronous) decoders. As before, the timing of the CSL signal will be adjusted depending upon the value of the read/write control signal.

FIG. 7 illustrates a schematic diagram of a variable delay circuit 32 that can be used in either of the embodiments of FIG. 5 or 6. The input signal CLKBST (or CSL' for the FIG. 6 embodiment) is provided to two paths. In the top path, the signal is coupled directly to transmission gate 34, which is conducting when the R/W' signal is low (indicating a write cycle). The input CLKBST is also coupled to a delay element 40, which is in turn coupled to a second transmission gate 36. Transmission gate 36 is conductive when the R/W' signal is high (indicating a read cycle). The outputs of the transmission gates 34 and 36 are tied together to provide the output signal CKA0 (or CSL). While transmission gates 34 and 36 are illustrated, it is understood that any tri-state driver can be used.

FIGS. 8a–8g show a detailed schematic diagram of an embodiment of a programmable delay circuit 32 used to delay the CKA0 signal in accordance with an embodiment of the present invention. The main difference between FIG. 8a and FIG. 7 is the implementation of the delay element 40. In FIG. 8a, the delay element 40 is divided between a plurality of delay segments 42. In this example, each delay segment 42 is implemented with two inverters. In other embodiments, other delays can be used. For example, more than two inverters can be used and/or capacitors (not shown) can be coupled between the inverters.

The clock signal CLKBST can be routed so that it is delayed by all four of the delay segments 42 or only some (or none) of the delay elements 42. In this example, this routing is implemented by a plurality of transmission gates 44, which are controlled by control signals TMCDLY, dly0, dly1, dly2, dly3, and their inverses. The delay signals dlyn are determined by TMCDLY and two other control signals TMC0 and TMC1.

In practice, the chip designer (or other user) will determine the desired amount of delay and program the control signals TMCDLY, TMC0 and TMC1 to the appropriate values to achieve the desired delay. Table 1 provides the delay options for the particular embodiment shown in FIG. 8a. The delay signals dlyn that control the transmission gates 44 can be generated using combinational logic as shown in FIGS. 8b–8g.

TABLE 1

| TMCDLY | TMC1 | TMC0 | Added Delay |
|---|---|---|---|
| 0 | X | X | 0 |
| 1 | 0 | 0 | 300 ps |
| 1 | 0 | 1 | 740 ps |
| 1 | 1 | 0 | 1280 ps |
| 1 | 1 | 1 | 1680 ps |

In this embodiment, the delay may be adjusted in increments ranging from about 300 ps to about 400 ps. These delays are determined by the delay values of each delay segment 42. Each segment can have the same amount of delay or a different amount of delay. In addition, the routing can be made as simple or complex as necessary to achieve the desired precision of delay. For example, the delay elements 42 could have values of 100 ps, 200 ps, 400 ps and 800 ps and transmission gates could be included between each delay segment 42 so that any combination of the delays is achievable. This embodiment would complicate the circuitry but would also allow any delay between zero and 1500 ps, within a 100 ps accuracy.

The delay circuit 40 may be tuned by varying the two signals TMC1 and TMC0, which may be entered in a different test mode. It will be understood that any number of delay set-points may be generated.

The amount of delay the delay circuit 40 produces is preferably changeable and/or programmable in a test mode. For example, after the memory device is fabricated, the delay may be iteratively tested to optimize the device performance. When an ideal amount of delay is determined, the device may include fuses which may be blown to store a programmed amount of delay. In this embodiment, any time the device is powered up, it will have the same amount of read cycle delay. Alternatively, the programming may be set up at start-up, or the device may be programmed by the user.

In one embodiment, the read delay is preferably adjustable in steps from 0 ns to approximately 1.5 ns, and the delay is controlled by fusable test modes. In this manner, advantageously, it is possible to customize the timing for different device configurations. For example, in FIG. 7, the delay is adjustable in four 400 ps steps using fusable test modes.

Embodiments of the present invention provide several advantages over prior art memory devices. A selective column path speed for read/write cycles is provided that balances $t_{RCD}$ and $T_{WR}$ for chip speed optimization. In one embodiment, the column activation delay control is programmable by a fusable test mode.

The invention has been described herein with particular relevance to the application of a DDR SDRAM; however, the novel concept of delaying the read CSL signal while not delaying the write CSL signal also has application in other semiconductor memory devices, such as other DRAM devices, static RAM (SRAM) devices, flash memories, resistive memory devices such as magnetic random access memories (MRAMs), and non-volatile memories such as electrically programmable read-only-memories (EPROMs), electrically erasable programmable read-only-memories (EEPROMs), and flash memory as examples.

The illustrated embodiments have also assumed a stand-alone chip, where the address and data are provided from external sources. The present invention, however, also applies to embedded memory where the memory array is included on the same substrate (or within the same package) as other control logic, such as a processor core or controller.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description.

What is claimed is:

1. A memory device comprising:
    a plurality of storage cells arranged in an array or rows and columns;
    a plurality of bitlines, each bitline coupled to a plurality of storage cells along one of the columns;
    a plurality of wordlines, each wordline coupled to a plurality of storage cells along one of the rows;
    a column decoder having a plurality of control outputs, each of the control outputs coupled to a column of the array; and
    a variable delay circuit coupled in series between the plurality of control outputs of the column decoder and the columns of the array, the delay circuit causing the control outputs of the column decoder to be variably delayed based upon a control input, such that the control outputs are delayed longer for a read cycle than for a write cycle.

2. The memory device according to claim 1, wherein the amount of delay time generated by the variable delay circuit is programmable.

3. The memory device according to claim 1, wherein the amount of delay time generated by the variable delay circuit is selected from only one of a first delay time or a second delay time only.

4. The memory device according to claim 1, wherein each storage cell includes a transistor coupled in series with a storage capacitor.

5. The memory device according to claim 4, wherein the memory device comprises a double data rate (DDR) synchronous DRAM (SDRAM).

6. The memory device according to claim 1 and further comprising:
    a plurality of address pins;
    a column address buffer with a plurality of inputs coupled to the plurality of address pins, the column address buffer further including an output coupled to an input of the column decoder;
    a row decoder having a plurality of control outputs, each of the control outputs coupled to a row of the array; and
    a row address buffer with a plurality of inputs coupled to the plurality of address pins, the row address buffer further including an output coupled to an input of the row decoder.

7. The memory device according to claim 1, wherein the delay circuit comprises:
    a clock input;
    a first transmission gate with an input coupled to the clock input, the first transmission gate comprising an n-channel transistor coupled in parallel with a p-channel transistor;
    a first delay element with an input coupled to an output of the first transmission case, the first delay element including at least one inverter;
    a second transmission gate with an input coupled to an output of the first delay element, the first transmission gate comprising an n-channel transistor coupled in parallel with a p-channel transistor;
    a second delay element with an input coupled to an output of the first delay element, the second delay element including at least one inverter;
    a third transmission gate with an input coupled to an output of the second delay element, the third transmission gate having an output coupled to an output of the second transmission gate, the third transmission gate comprising an n-channel transistor coupled in parallel with a p-channel transistor; and
    logic circuitry adapted to generate a delay time, wherein the amount of delay is variable by activating particular combinations of the first, second and third transmission gates.

8. The memory device according to claim 7, wherein the amount of delay time generated by the variable delay circuit is selected from one of a first delay time or a second delay time only, wherein the first delay time corresponds to the first delay element and the second delay time corresponds to the first and second delay elements.

9. The memory device according to claim 7, wherein the delay circuit includes two paths, a first one of the paths including the first and second delay elements, the delay circuit further including two tri-state drivers controlled by a signal received at the variable delay control input, the two tri-state drivers controlling the output of a signal from one of the two paths.

10. The memory device of claim 7, wherein the delay circuit further comprises a fourth transmission gate with an input coupled to the clock input and an output coupled to the outputs of the second and third transmission gates, wherein the amount of delay is variable by activating particular combinations of the first, second, third and fourth transmission gates.

11. The memory device of claim 10, wherein the outputs of the second, third and fourth transmission gates comprise an output of the variable delay circuit, the output of the variable delay circuit being coupled to a clock input of the column decoder.

12. The memory device according to claim 1, wherein the variable delay comprises:
   a first tri-state driver with an input coupled to the variable delay input, the first tri-state driver having an output coupled to the variable delay output;
   a delay element with an input coupled to the variable delay input; and
   a second tri-state driver with an input coupled to an output of the delay element, the second tri-state driver having an output coupled to the variable delay output.

13. The memory device according to claim 12, wherein the delay element comprises a programmable delay.

14. The memory device according to claim 13, wherein the delay element includes a plurality of delay segments, the delay element further including at least one control signal indicating which, if any, of the segments are included in a signal path between the variable delay input and the variable delay output.

15. The memory device according to claim 14, wherein the delay element includes four delay segments.

16. The memory device according to claim 1, wherein the variable delay comprises:
   a first tri-state driver with an input directly connected to the variable delay input, the first tri-state driver having an output directly connected to the variable delay output;
   a delay element with an input coupled to the variable delay input; and
   a second tri-state driver with an input coupled to an output of the delay element, the second tri-state driver having an output coupled to the variable delay output.

17. The memory device according to claim 1, wherein the control input receives an indication of whether a current cycle is a read cycle or a write cycle, the indication of whether the current cycle is a read cycle or a write cycle being based upon an externally received read/write signal.

* * * * *

UNITED STATES PATENT AND TRADEMARK OFFICE
CERTIFICATE OF CORRECTION

PATENT NO. : 7,149,134 B2
APPLICATION NO. : 11/259703
DATED : December 12, 2006
INVENTOR(S) : Streif et al.

It is certified that error appears in the above-identified patent and that said Letters Patent is hereby corrected as shown below:

Column 9, line 66; delete "array or rows" insert --array of rows--

Signed and Sealed this

First Day of May, 2007

JON W. DUDAS
*Director of the United States Patent and Trademark Office*